United States Patent
Antognetti et al.

(10) Patent No.: US 6,373,339 B2
(45) Date of Patent: Apr. 16, 2002

(54) ACTIVE BIAS NETWORK CIRCUIT FOR RADIO FREQUENCY AMPLIFIER

(75) Inventors: Phillip Antognetti, Chelmsford, MA (US); Jim Griffiths, Londonderry, NH (US); David Helms, Tyngsboro, MA (US); James Moniz, Poughquag, NY (US); Scott Munro, Wilmington; Joshua Park, Madford, both of MA (US); Carl Stuebing, The Dalles, OR (US); Xiangdong Zhang, Westford, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/879,933

(22) Filed: Jun. 14, 2001

Related U.S. Application Data

(63) Continuation of application No. 09/599,516, filed on Jun. 23, 2000, now Pat. No. 6,259,324.

(51) Int. Cl.[7] ............................................... H03F 3/04
(52) U.S. Cl. ....................................... 330/296; 323/313
(58) Field of Search ............................... 323/313, 314, 323/315, 316; 330/296, 290, 288, 298

(56) References Cited

U.S. PATENT DOCUMENTS

| | | | | |
|---|---|---|---|---|
| 4,317,054 A | * | 2/1982 | Caruso et al. | 307/297 |
| 5,229,708 A | * | 7/1993 | Donig et al. | 323/223 |
| 5,554,968 A | | 9/1996 | Lee | |
| 5,629,648 A | | 5/1997 | Pratt | |
| 5,666,044 A | * | 9/1997 | Tuozzolo | 323/277 |
| 5,796,244 A | * | 8/1998 | Chen et al. | 323/313 |
| 5,920,184 A | * | 7/1999 | Kadanka | 323/314 |
| 5,963,094 A | | 10/1999 | Linder et al. | |
| 6,034,519 A | * | 3/2000 | Yang | 323/316 |
| 6,087,820 A | * | 7/2000 | Houghton et al. | 323/315 |
| 6,144,845 A | * | 9/2000 | Capici et al. | 323/313 |
| 6,148,220 A | * | 11/2000 | Sharp et al. | 455/572 |
| 6,271,652 B1 | * | 8/2001 | Burstein et al. | 323/313 |

* cited by examiner

*Primary Examiner*—Robert Pascal
*Assistant Examiner*—Henry Choe
(74) *Attorney, Agent, or Firm*—Connolly Bove Lodge & Hutz; Joseph P. Abate

(57) ABSTRACT

A bias network for a radio frequency signal power amplifier. A current source is connected to a source of band gap voltage and produces a current proportional to the voltage. A reference voltage circuit receives the current and produces a voltage which is proportional to the current, as well as changes in temperature. An operational amplifier is used to connect the reference voltage to the power amplifier, so that the power amplifier is effectively isolated from the reference voltage circuit and current bearer circuit. A power amplifier breakdown protection circuit is connected across the output of the operational amplifier for diverting avalanche current produced form the power amplifier away from the power amplifier when the power amplifier output is mismatched through the antenna. Baseband signal transmission from the power amplifier to the bias network circuit is also significantly reduced, thus avoiding the generation of spurious radiation components.

5 Claims, 3 Drawing Sheets

ACTIVE BIAS NETWORK CIRCUIT FOR RADIO FREQUENCY AMPLIFIER

This application is a continuation of Ser. No. 09/599,516 filed Jun. 23, 2000 U.S. Pat. No. 6,259,324.

BACKGROUND OF THE INVENTION

The present invention relates to the portable telephone communications art. Specifically, an active bias network circuit is described which provides a stable reference voltage to a radio frequency amplifier.

Portable telephone communications require a transmitter which is small and which conserves battery power. Additionally, these low power transmitters are subject to both a changing battery power supply voltage, which varies between a high charge level, after being charged, to a lower voltage level when the battery of the telephone discharges. The power amplifier of the telephone transmitter is also subject to thermal overload, due to reflected power from the antenna when it is not impedance matched to the amplifier output stage. Under reflected power conditions, a current is produced from the bipolar transistors of the amplifier which can produce a thermal runaway condition. Additionally, during operation, certain types of modulation, such as CDMA for instance, will produce a baseband modulation component which enters the bias networks for the output amplifier. Under these conditions, the baseband modulation entering the bias network circuit may and be conveyed to other circuits, producing undesirable spurious radiation components in the output power spectrum.

In order to protect the telephone transmitter from these conditions, a bias network must be provided which is isolated from the power amplification stages, and the power amplification stages must be protected against high voltage currents which would produce the thermal runaway condition. Further, these protections must be implemented so that an acceptable current drain is imposed on the battery power supply for the telephone.

SUMMARY OF THE INVENTION

A bias network for a power amplifier is provided which is isolated from baseband signals and radio frequency signals produced by the power amplifier. A current source is connected to a source of band gap voltage which produces a current proportional to the band gap voltage. A reference voltage circuit receives the current and produces a voltage proportional to the current and to the temperature of the device. The voltage is applied as a bias voltage through an operational amplifier to the power amplifier output transistors. The operational amplifier isolates the current source and reference voltage circuit from any baseband signal emanating from the power amplifier output stage. A power amplifier breakdown protection circuit is also connected to the power amplifier output stage to divert avalanche current which is produced by the power amplifier during an antenna mismatch or high supply voltage condition. Under these circumstances, the diversion of the current keeps the transistors of the power amplifier output stage from entering a thermal runaway mode.

In accordance with a preferred embodiment of the invention, a voltage regulator circuit is also connected in series to the power amplifier output stage transistors. The voltage regulator maintains the voltage to the power amplifier output transistors at a substantially constant level during a high battery voltage condition. As the supply voltage decreases, the regulator ceases operation and the full power supply voltage is applied to the output transistors.

DESCRIPTION OF THE FIGURES

FIG. 4 illustrates a power protection circuitry for preventing the effects of battery supply voltage on the generation of baseband frequency components on the bias circuit network.

DETAILED DESCRIPTION OF THE PREFERRED EMBODIMENT

Figure 1:
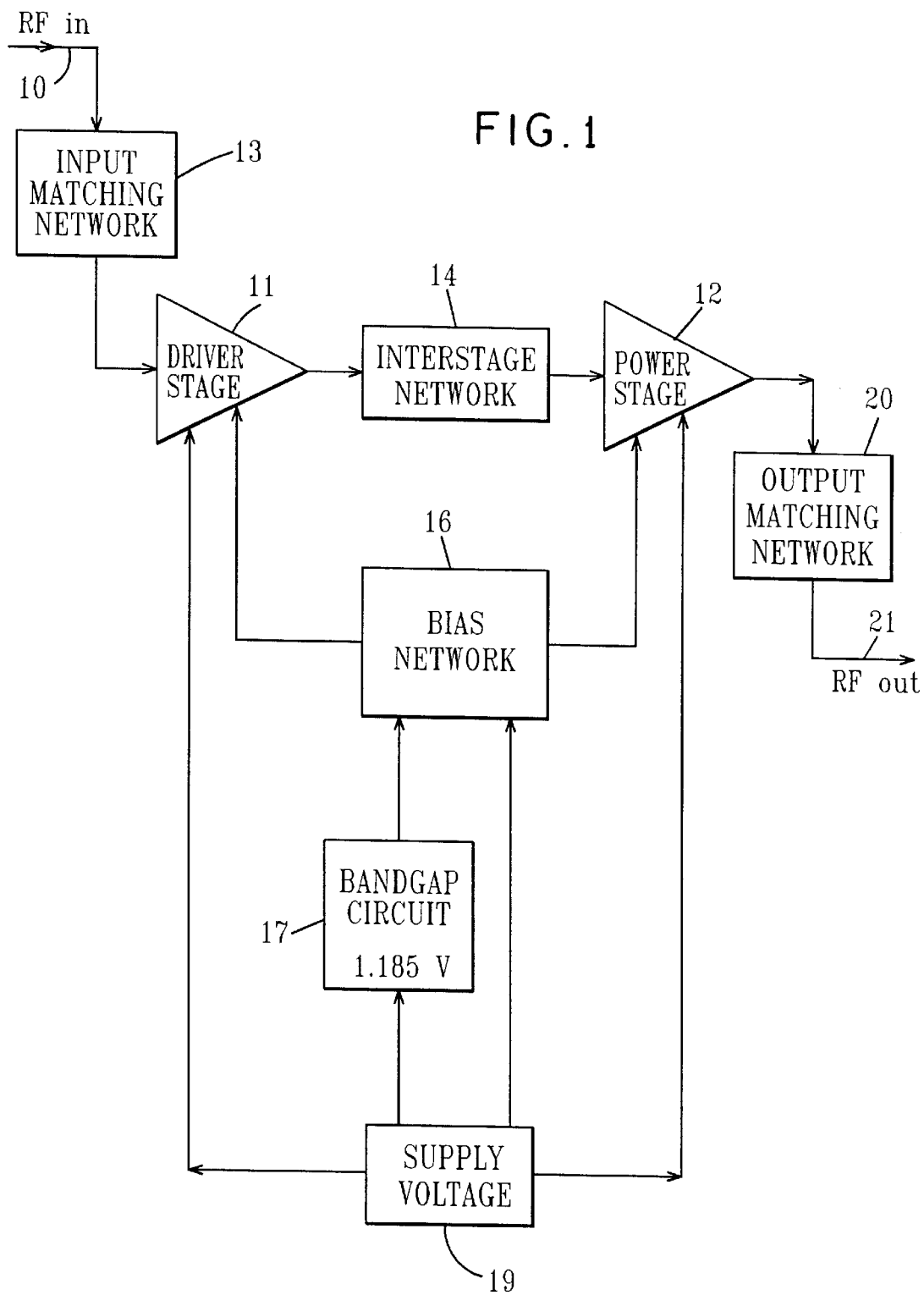
FIG. 1 illustrates the block diagram of a two stage portable telephone transmitter output amplifier.

FIG. 1 is a block diagram illustrating the power amplification circuit for a portable telephone. A signal generator applies a radio frequency signal at input 10 which is to be amplified and applied to an antenna terminal 21. The source of RF input signal is impedance matched with impedance matching network 13 to a driver amplification stage 11. The driver amplification stage 11 is impedance matched by the interstage matching network 14 to an output power amplifier stage 12. The output power amplifier stage 12 is in turn impedance matched via the output matching network 20 to an output port 21 connected to an antenna. The power amplification stages 11 and 12 are connected to a power supply 19 which is a multicell battery power supply. The battery power supply 19 applies both the operating voltage to the driver stage 11 and power stage 12, as well as an operating voltage for a band gap circuit 17 and bias network 16. The band gap circuit 17 conventionally produces a reference voltage of approximately 1.186 volts which, in the preferred embodiment, is used by the bias network 16 to establish a bias voltage for the driver stage 11 and power stage 12.

One of the common problems encountered with the power amplifier of FIG. 1 is the condition of a mismatch between the power amplification stage 12 and antenna connected to the output port 21. During a mismatch, which results in portable telephones on a frequent basis due to the frequent changes in position of the antenna versus its environment, reflected power is applied to the power amplification stage 12. The reflected power produces a current which flows through the collector-base junction, and thence through the base-emitter junction. An unstable thermal runaway condition for the transistors of the output power amplification stage 12 results causing the transistors to fail. Further, the bias network 16 which is connected to the supply voltage and other circuits of the telephone, may conduct baseband signals from the power amplifier circuit which are contained in the radio frequency signal. These baseband signals are propagated throughout the circuit, producing spurious radio frequency signals in the output radio frequency signal.

The present invention provides a bias network which is isolated from radio frequency signals in the power amplification stage. Further, protection is built into the power amplification stage 12 and bias network 16 to avoid the condition of a thermal runaway due to avalanche current produced when reflected power is received in the power amplification stage.

Figure 2:
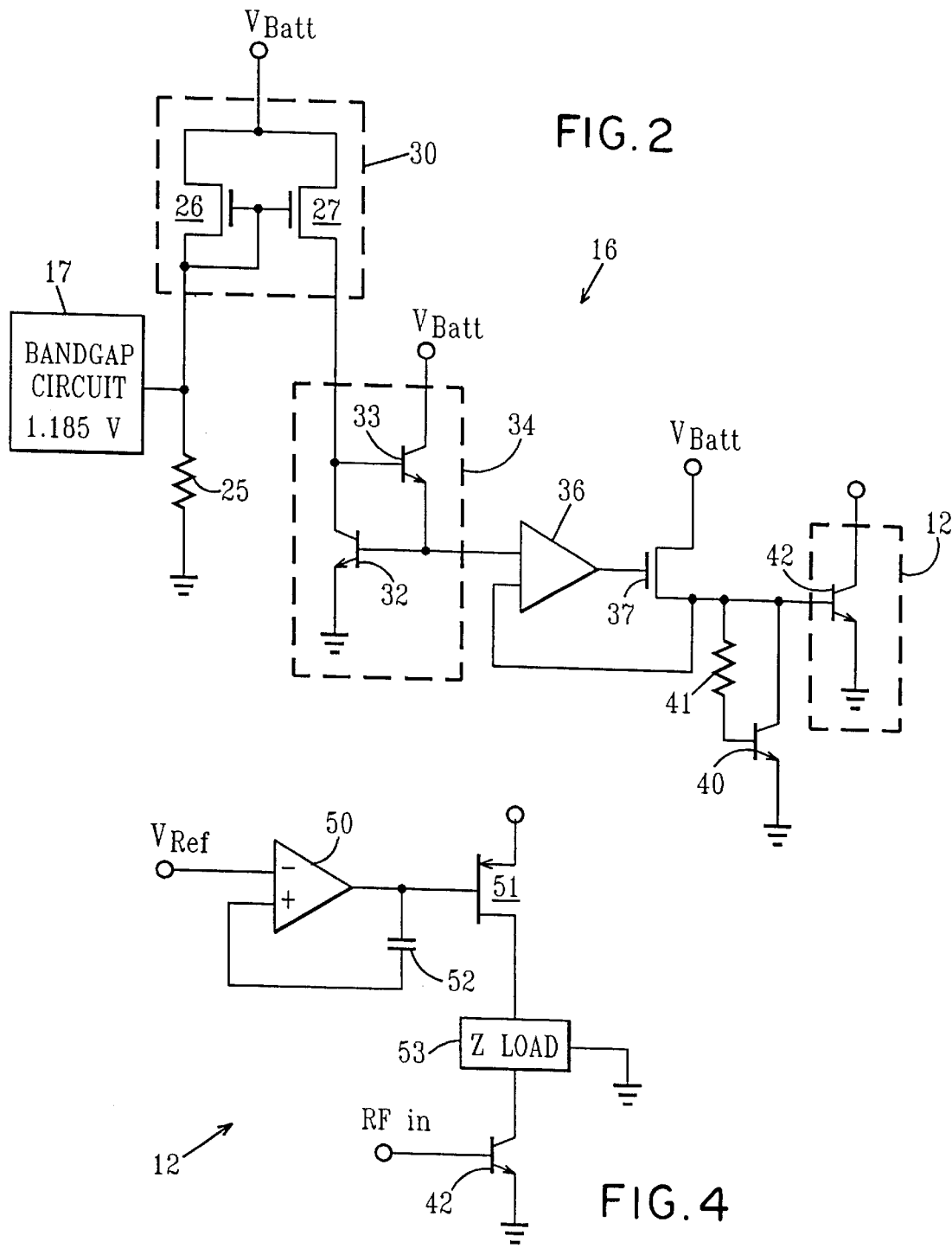
FIG. 2 illustrates the bias network in accordance with a preferred embodiment of the invention.

FIG. 2 illustrates one embodiment of the invention which provides this objective. A band gap circuit, which provides a stable voltage reference over temperature and battery supply voltage variations, output voltage is applied to a reference resistor 25. A current mirror circuit 30, having two field effect transistors 25 and 26, generates a reference current Iref1 through the reference resistor 25. The common source connections of the current mirror transistors 25 and 26, and one end of the reference resistor 25, are connected to the battery supply voltage.

The current mirror produces a current Iref2 which is proportional to the current Iref1 through the reference resistor 25. The Iref2 current in a conventional current mirror circuit is proportional to the size of the transistors 26 and 27.

A reference voltage circuit 34 produces a reference voltage from the current Iref2. The reference voltage circuit 34 includes two bipolar transistors 32 and 33. Transistor 32 has a collector connected to the base of transistor 33. A supply voltage of the telephone is applied across the collector of transistor 33 and emitter of transistor 32.

Reference voltage circuit 34 produces a voltage which is controlled by Iref2, which is in turn set by the band gap voltage across the reference resistor 25. As the temperature often changes, the voltage produced from the reference voltage circuit 34 will also change to complement changes in the base-emitter junction voltage of the transistor 42 of the power amplification stage 12.

The bias voltage produced from the reference voltage circuit 34 is supplied in an operational amplifier 36 and NFET driver 37. The operational amplifier 36 and NFET driver 37 produce a unity gain at d.c., and effectively isolate the bias network 16 from any currents produced from the power amplification stage 12.

The circuit of FIG. 2 includes avalanche current protection. The avalanche current protection is provided for by bipolar transistor 40 and resistor 41. in the event that avalanche current is generated by bipolar transistor 42, the transistor 40 will provide a low impedance to ground for the avalanche current, diverting the current away from the base emitter junction of transistor 42, thus helping to avoid a thermal runaway condition for bipolar transistor 42 of power amplification stage 12. Additionally, any baseband modulation products which flow from the power amplification stage 12 into the bias network 16, are more effectively isolated from the reference circuit 34, current mirror 30 and band gap circuit 17 due to the conduction of transistor 40. Thus, radio frequency baseband signals which can produce spurious radio frequency signal components in the output signal spectrum are effectively isolated from the remaining portion of the power amplifier circuit.

Figure 3:
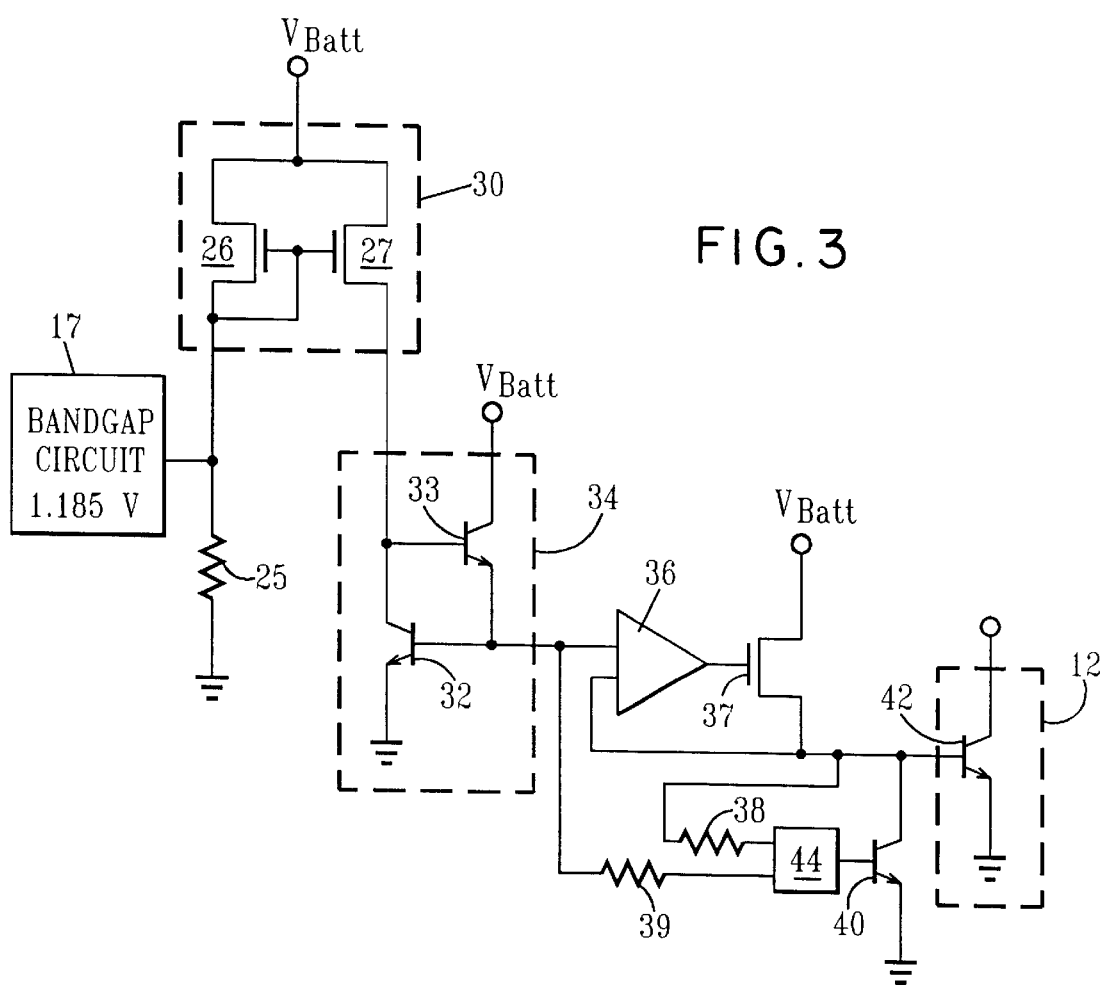
FIG. 3 is a schematic illustration of a second embodiment of the invention which controls the dissipation of avalanche current.

FIG. 3 represents another embodiment of the invention for producing a bias voltage which is isolated from baseband signal components in the output amplification stage 12. The distinction between the embodiment of FIG. 3 and FIG. 2 resides in the implementation of the avalanche current protection. The avalanche transistor 40 of FIG. 3 is shown having a base connection connected to an Differential Pair Circuit 44. Differential Pair Circuit 44 has a pair of inputs connected through resistors 38 and 39 to the base of the output amplification stage transistor 42 and to the reference voltage circuit 34. The advantage realized by the embodiment of FIG. 3 is that the avalanche transistor 40 may be set to conduct less current during the telephone standby mode when it is not experiencing an avalanche current from the output amplification stage 12. Reduced current through the avalanche transistor 40 helps preserve the life of the battery power supply. This is particularly advantageous when the power amplification circuit is operated in a back off mode, as is common in the GSM mode. Since the back off mode produces few baseband signal components and lower reflected power conditions, only a minor amount of current need be dissipated through the avalanche transistor 40.

The avalanche transistor 40 is turned on harder when avalanche current from the collector-base junction of output amplification stage transistor 42 increases, causing a voltage imbalance between the inputs of differential pair circuit 44. Thus, only a small amount of current is dissipated until such time as an increased amount of avalanche current is produced.

The consequences of reflected power as a result of a poor match between the power amplification circuit and the antenna is exacerbated when the power supply voltage for the circuit is elevated due to charging of the battery power supply. After completely charging the battery power supply, the battery power supply voltage across the output transistor 42 of the amplification stage, together with reflected power generated by the impedance mismatch, produce a high avalanche current condition for transistor 42. In addition to the protection circuit for diverting the avalanche current away from the transistor 42, an output voltage regulator may be used in the power stage amplification stage 12. The voltage regulator stage will limit the voltage applied across the transistor 12 of the output power amplification stage 12 when the supply voltage is above a reference level.

An implementation of this voltage regulator is shown in FIG. 4. The battery voltage is shown connected through a load impedance 53 to transistor 42 of the power amplification stage 12. A comparator 50 is shown which compares a voltage across the load impedance 53 and transistor 42 with a reference potential. Under high charge conditions, wherein the battery voltage is charged to a high value, the comparator 50 will compare the value of the voltage to a reference voltage. Capacitor 52 assists in re-establishing the regulated voltage across the load 53 and transistor 42 when the battery voltage is in a high charge condition.

As the battery voltage decreases, due to current drain by the telephone, the FET 51 will no longer regulate the voltage supply, but instead will act as a low loss switch placing the full supply voltage across the load impedance for the transistor 42. In this way, high voltage produced from reflected power is not compounded by the presence of a high charge battery voltage.

The circuit slightly degrades the power and efficiency when operating with a battery voltage above the reference voltage, and when operating below the voltage, the PFET 51 operates as a switch. The power and efficiency of the amplification stage is within 2% of a circuit having no collector voltage regulation. Thus, the impact on battery life is minimized, while preventing the catastrophic failure of the output transistor 42 due to thermal runaway. The compensation capacitor 52 provides for compensation of the voltage regulator.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

Also, it is intended that the appended claims be construed to include alternative embodiments.

What is claimed is:

1. A circuit for protecting a radio frequency power amplifier comprising:
   a bias circuit for providing a reference voltage to said power amplifier; and
   a voltage regulator for maintaining the voltage to said power amplifier at a substantially constant level as a result of a change in operating voltage.

2. The circuit for protecting a radio frequency power amplifier according to claim 1 wherein said voltage regulator ceases maintaining said voltage to said power amplifier at said constant level when said operating voltage is below a threshold voltage.

3. The circuit according to claim 1 wherein said reference voltage is connected to said power amplifier with an operational amplifier.

4. The circuit according to claim 1 wherein said voltage regulator circuit comprises:
   an operational amplifier having a first input connected to a source of reference voltage, and a second input connected to said power amplifier; and
   a field effect transistor having a source drain circuit serially connecting said power amplifier and a supply of operating voltage, and having a gate connected to said operational amplifier output, said field effect transistor providing regulation of the voltage applied to said power amplifier when said supply of operating voltage exceeds a threshold voltage.

5. The circuit according to claim 1 wherein said field effect transistor is a PFET which constitutes a low loss switch when the gate to source voltage is below a threshold value.

* * * * *